United States Patent
Patel et al.

(10) Patent No.: US 6,739,041 B2
(45) Date of Patent: May 25, 2004

(54) CIRCUIT BOARD AND A METHOD FOR MAKING THE SAME

(75) Inventors: Bharat Z. Patel, Canton, MI (US); Jay D. Baker, Dearborn, MI (US); Mohan R. Paruchuri, Canton, MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 271 days.

(21) Appl. No.: 09/815,234

(22) Filed: Mar. 22, 2001

(65) Prior Publication Data

US 2001/0037898 A1 Nov. 8, 2001

Related U.S. Application Data

(60) Provisional application No. 60/207,647, filed on May 26, 2000.

(51) Int. Cl.⁷ .................................................. H05K 3/20
(52) U.S. Cl. .............................. 29/831; 29/846; 29/852; 29/847; 29/845; 29/825
(58) Field of Search ........................... 29/831, 846, 852, 29/847, 825, 845; 174/255, 261; 361/792, 795, 794

(56) References Cited

U.S. PATENT DOCUMENTS

| | | | |
|---|---|---|---|
| 3,801,388 A | | 4/1974 | Akiyama et al. |
| 4,404,059 A | | 9/1983 | Livshits et al. |
| 5,116,459 A | * | 5/1992 | Kordus et al. .............. 216/20 |
| 5,148,260 A | * | 9/1992 | Inoue et al. ............... 257/762 |
| 5,509,553 A | * | 4/1996 | Hunter et al. .............. 216/13 |
| 5,738,797 A | | 4/1998 | Belke, Jr. et al. |
| 5,744,758 A | * | 4/1998 | Takenouchi et al. ........ 174/255 |
| 5,819,406 A | * | 10/1998 | Yoshizawa et al. ........... 29/877 |

FOREIGN PATENT DOCUMENTS

JP          3-142996 A  *  6/1991  ............ H05K/3/46

* cited by examiner

Primary Examiner—Carl J. Arbes
Assistant Examiner—Tai Nguyen
(74) Attorney, Agent, or Firm—Visteon Global Tech., Inc.

(57) ABSTRACT

A method 10, 90 for making a multi-layer electronic circuit board 82, 168 including the steps of forming at least one protuberance 15, 100 upon an electrically conductive member 12, 92 and adding additional electrically conductive layers of material 34, 56, 58, 104, 114, 138, 140 to the member 12, 92 while selectively extending the protuberance 15, 100 within the layers 82, 168, thereby forming a circuit board 82, 168. A portion of the formed circuit board may be etched in order to selectively create air-bridges 86 or interconnection portions 164.

13 Claims, 6 Drawing Sheets

CIRCUIT BOARD AND A METHOD FOR MAKING THE SAME

This application claims the benefit of Provisional Application No. 60/207,647, filed May 26, 2000.

FIELD OF THE INVENTION

The present invention relates to an electrical circuit board and a method for making a multi-layer electrical circuit board and, more particularly, to a method for making a multi-layer electrical circuit board having at least one electrically conductive interconnection portion or "via" which selectively allows various portions and/or components residing within and/or upon the multi-layer electrical circuit board to be electrically and operatively connected, and which further includes at least one air-bridge or crossover member to desirably increase component density.

BACKGROUND OF THE INVENTION

Multi-layer circuit boards allow electrical components to selectively and operatively populate opposed surfaces of each board (or other respective interior portions of each of the boards), thereby desirably allowing each of the electrical circuit boards to contain a relatively large amount of electrical components which efficiently and densely populate the respective boards. It is desirable to allow at least some of the component-containing surfaces or portions of a created and/or formed electrical circuit board to communicate and/or to be selectively interconnected, thereby allowing the contained electrical components to cooperatively and selectively form one or more desired electrical circuits. This desired communication and/or interconnection typically requires the use of shared electrical ground planes, the transmittal of electrical power and/or control type signals between each of the component containing surfaces or board portions, and/or the connection of components which respectively reside on opposed surfaces and/or within diverse portions of the formed electrical circuit board.

This desired interconnection typically requires that one or more holes be drilled within and/or through each of the circuit boards, thereby creating at least one "through hole" or "via" traversing each of the opposed component containing surfaces and through the various interior circuit board portions. Such drilling is undesirable since it is relatively time consuming, costly, potentially causes damage to significant numbers of the formed electrical circuit boards requiring these circuit boards to be destroyed, and requires costly and inefficient electroless and/or electrolytic plating of the formed holes or "vias".

While some attempts have been made to obviate the need for such plating, such as by the use of a conductive epoxy within each of the drilled holes, these attempts have not produced reliable electrical interconnections and these produced interconnections are not typically adapted to allow the communication of electrical power signals between the board surfaces. The produced apertures also do not securely and reliably receive a component.

Further, it is desirable to form "air-bridges" or "crossover type circuits" upon one or more selected surfaces and/or within certain component containing portions of the formed circuit board in order to allow multiple levels of circuits and/or electrical interconnections to be formed upon a single board surface or within a certain component containing portion of the circuit board, thereby desirably increasing the amount of electrical circuits which may be created upon and/or within the created circuit board (i.e., increasing the electrical circuit density).

These prior circuit board creating methodologies create and or form air-bridges and crossover circuits which do not typically and efficiently accommodate certain desirable circuit board interconnection processes and/or schemes such as and without limitation, the use of relatively heavy wire bonding (e.g., using aluminum wire having a diameter of about five thousandths of an inch to about twenty thousandths of an inch) or the direct connection of components to a surface of the board.

There is therefore a need to provide a method for producing a multi-layer electrical circuit board which overcomes some or all of the previously delineated drawbacks of prior circuit boards and/or circuit board forming processes, which selectively allows for the efficient creation of interconnection portions which extend within at least some of the various layers of the formed electrical circuit board assembly, and which further allows for the efficient and selective formation of air-bridges or crossover members and/or circuits which desirably accommodate diverse types of circuit interconnection processes.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the invention to provide a method for producing a multi-layer electrical circuit board which overcomes some or all of the previously delineated drawbacks of prior multi-layer electrical circuit board forming methodologies and techniques, which allows the formed circuit board to receive various contained electronic components, which allows for the selective, efficient, and reliable formation of electrically conductive interconnection portions which selectively and cooperatively allow for communication and/or electric connection by and between at least some of these various electronic components, and which allows these crossover members and/or air-bridges to be selectively created and/or formed without drilling.

It is a third object of the invention to provide a method for producing a multi-layer electrical circuit board which overcomes some or all of the previously delineated drawbacks of prior multi-layer electrical circuit board forming methodologies and techniques and which allows for the selective and efficient formation of air bridges and/or crossover members which are adapted to accommodate a wide variety of components and component interconnection techniques and/or assemblies.

According to a first aspect of the present invention, a method for making a multi-layer electric circuit board is provided. The method includes the steps of providing a first electrically conductive member; creating at least one protuberance upon the first electrically conductive member; providing a second electrically conductive member; providing at least one pre-circuit assembly; and attaching the second electrically conductive member and the at least one pre-circuit assembly to the first electrically conductive member, thereby creating a multi-layer circuit assembly and causing the at least one protuberance to extend within the multi-layer circuit assembly.

According to a second aspect of the present invention, a circuit assembly is provided. The circuit assembly is made by the process of providing a first electrically conductive member; creating a plurality of protuberances upon the first electrically conductive member; attaching a plurality of second electrically conductive members to the first electrically conductive members, thereby forming a multi-layer circuit assembly; and creating at least one interconnection path within the multi-layer circuit assembly by use of the plurality of protuberances.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1A:
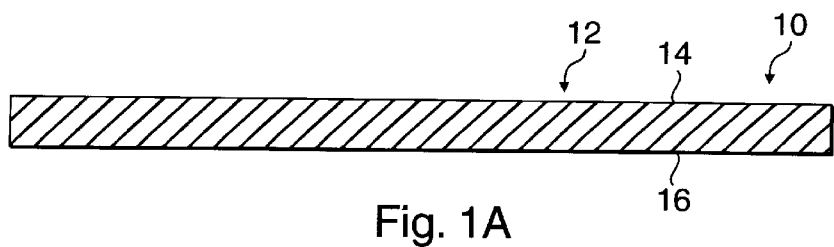
FIGS. 1(a)–(j) are successive sectional side views of a multi-layer circuit board being produced and/or formed in accordance with the teachings of the preferred embodiment of the invention.

Referring now to FIGS. 1(a)–(j), there is shown a process 10 for making an electrical circuit board assembly in accordance with the teachings of the preferred embodiment of the invention. Particularly, process 10 begins by obtaining and/or providing a member 12 having a first or top surface 14 and a second bottom surface 16, as best shown in FIG. 1(a). In one non-limiting embodiment of the invention, member 12 is generally rectangular and comprises a conventional and commercially available electrically conductive material such as copper. In a further non-limiting embodiment of the invention, the thickness of member 12 is about four thousandths of an inch, although other shapes, sizes, and thicknesses may be utilized.

Figure 1B:
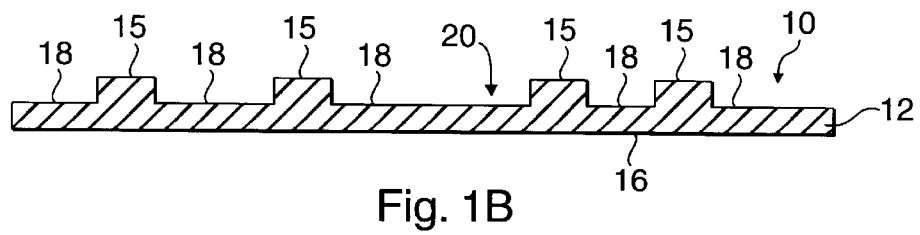

In a second step of process 10, which is best shown in FIG. 1(b), some portions of member 12 are selectively removed by a conventional etching process, thereby selectively creating certain recessed or depressed portions 18 and several nubs, bumps, and/or protuberances 15. Particularly, these nubs, bumps, and/or protuberances 15 comprise the portions of top surface 14 which are "left" and/or remain intact by the foregoing etching process, thereby forming member 20. As later explained, protuberances 15 selectively form "vias" or "crossover circuit interconnections".

Figure 1C:
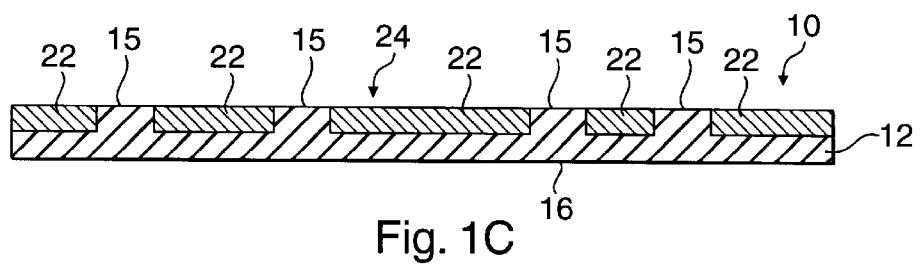

In the third step of process 10, which is best shown in FIG. 1(c), a certain substance or material 22 is applied upon member 12 and substantially "fills" depressed portions 18, thereby forming a pre-circuit assembly 24. In one non-limiting embodiment of the invention, material 22 comprises a conventional and commercially available dielectric material such as an acrylic material.

Figure 1D:
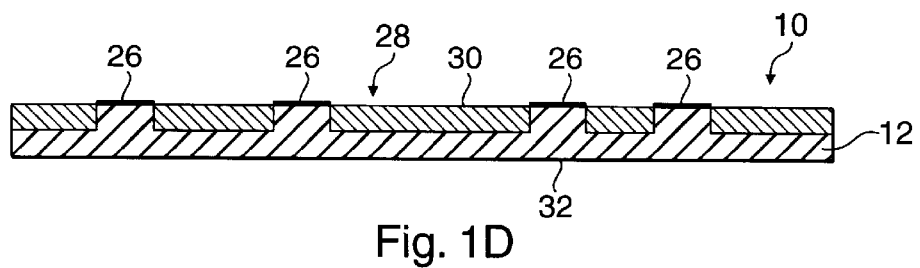

In the fourth step of process 10, which is best shown in FIG. 1(d), a layer of a certain substance or material 26 substantially "covers" and/or overlays each of the protuberances 15 to form a pre-circuit assembly 28 having a top surface 30 and a bottom surface 32. In one non-limiting embodiment of the present invention, material 26 comprises a conventional and commercially available tin based alloy or any other conventional conductive epoxy material and is metallurgically bonded to members 15.

Figure 1E:
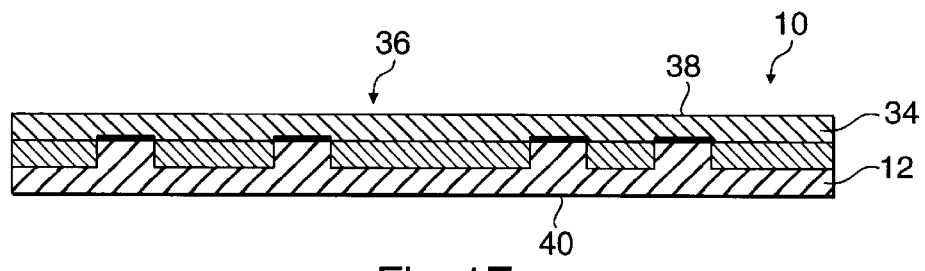

In the fifth step of the process 10, which is shown best in FIG. 1(e), a member 34 is operatively attached to the top surface 30 of pre-circuit assembly 28 (i.e., to material 26 and to material 22), thereby forming pre-circuit assembly 36 having a top surface 38 and a bottom surface 40. In one non-limiting embodiment of the invention, member 34 comprises a conventional and commercially available electrically conductive material such as copper and is metallurgically bonded to material 26 and laminated to material 22. In a further non-limiting embodiment of the invention, the thickness of member 34 is about two thousandths of an inch.

Figure 1F:
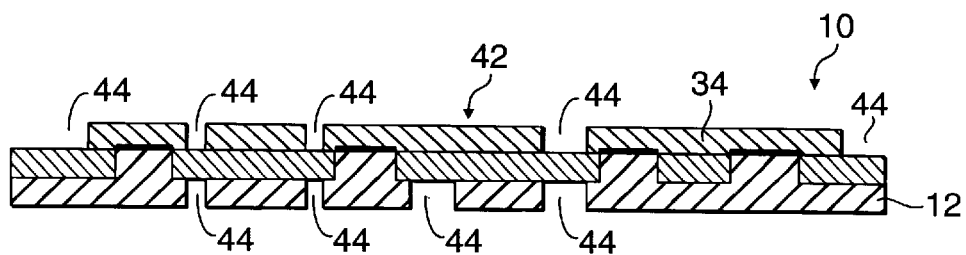

As best shown in FIG. 1(f), process 10 continues with the creation of a pre-circuit assembly 42 which is created by subjecting pre-circuit assembly 36 to a commercially available etchant material which selectively forms apertures through surfaces 38, 40 of pre-circuit assembly 36, thereby creating recessed, depressed, or aperture portions 44 within members 12, 34 and terminating upon and/or within material 22, effective to expose certain portions of the material 22.

Figure 1G:
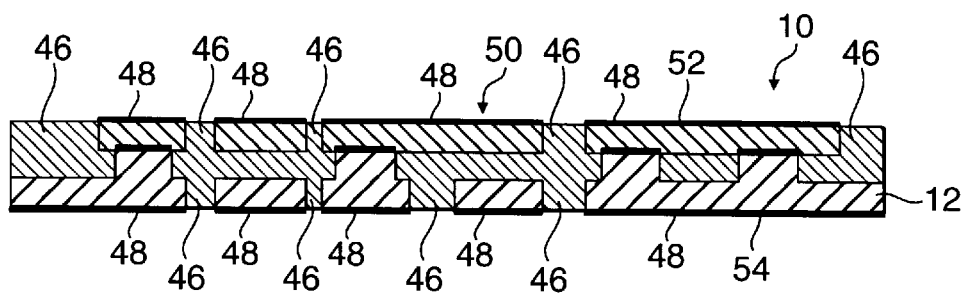

As best shown in FIG. 1(g), process 10 continues by further applying a certain substance or material 46 upon the exposed material 22, effective to substantially "fill" recessed, depressed, or aperture portions 44 and further applying a certain substance or material 48 to substantially "cover" and/or overlay the remaining or "unetched" portions of surfaces 38, 40, thereby creating pre-circuit assembly 50 having a top surface 52 and a bottom surface 54.

In one non-limiting embodiment of the invention, material 46 comprises a conventional and commercially available dielectric material such as an acrylic material and is substantially similar to or identical to material 22. In a further non-limiting embodiment of the invention, material 46 is laminated to the exposed material 22. In a further non-limiting embodiment of the invention, material 48 comprises a conventional and commercially available tin based alloy or any other conventional conductive epoxy. In a further non-limiting embodiment of the invention, material 48 is substantially similar to and/or identical material 26. In a further non-limiting embodiment of the invention, material 48 is metallurgically bonded to the remaining portions of surfaces 38, 40.

Figure 1H:
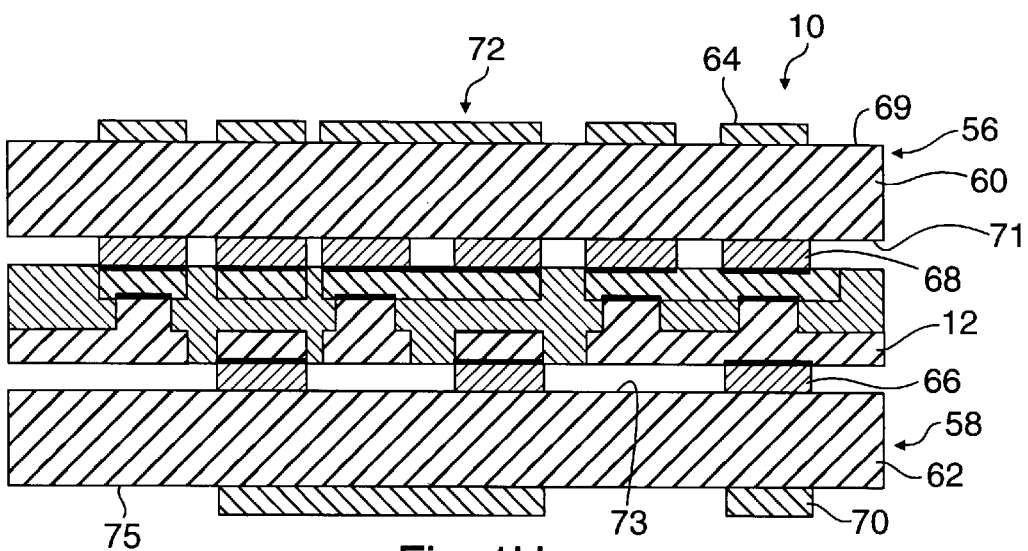

Process 10 continues, as best shown in FIG. 1(h), by obtaining and/or providing two pre-circuit assemblies 56, 58. Each pre-circuit assembly 56, 58, in one non-limiting embodiment of the invention, respectively includes a core portion 60, 62. As shown, core member or portion 60 includes several portions or members 64 and 68 which are respectively and operatively disposed upon top and bottom surfaces 69, 71. Core member or portion 62 includes several portions or members 66, 70 which are respectively and operatively disposed upon top and bottom surfaces 73, 75. Members 68 of pre-circuit assembly 56 are operatively attached to the top surface 52 of pre-circuit assembly 50 (i.e., to member 34 or material 46) and member 66 of pre-circuit assembly 62 is attached to the bottom surface 54 of pre-circuit assembly 50 (i.e., to member 12 or material 46), thereby creating pre-circuit assembly 72. It should be appreciated that in other non-limiting embodiments of the invention, pre-circuit assemblies 56, 58 may be replaced by other conventional circuit boards including without limitation conventional "FR-4" type circuit boards or circuit boards of the polyamide type.

In one non-limiting embodiment of the invention, members 64, 68, 66, and 70 each comprise a conventional and commercially available electrically conductive material such as copper. In a further non-limiting embodiment of the invention, core portions 60, 62 each comprise a conventional and commercially electrically conductive material such as aluminum. In a further non-limiting embodiment of the invention, members 66, 68 are respectively attached to surfaces 54, 52 by respectively laminating members 66, 68 to surfaces 54, 52.

Figure 1I:
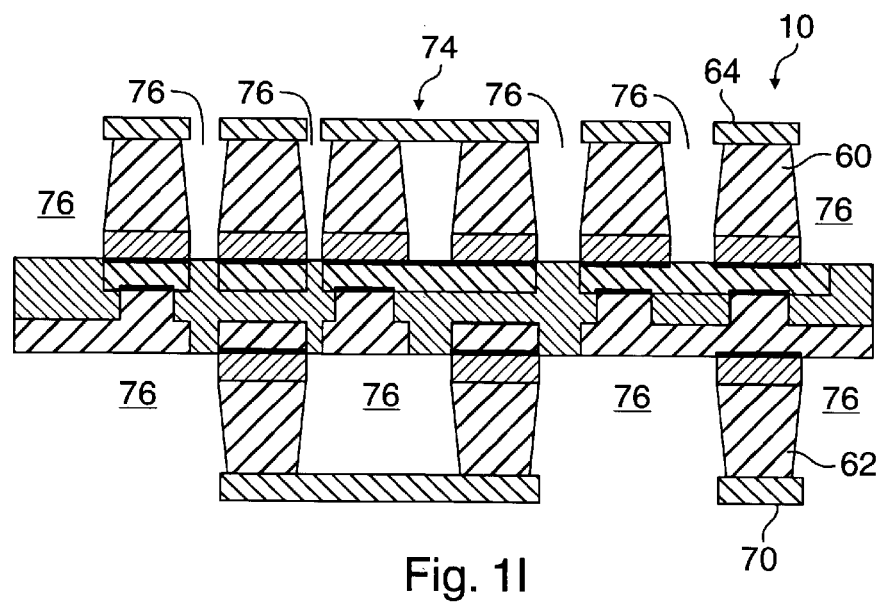

As best shown in FIG. 1(i), process 10 continues with the creation of a pre-circuit assembly 74 which is created by selectively subjecting core portions 60, 62 of pre-circuit assembly 72 to a commercially available etchant material which selectively forms apertures 76 within core portions 60, 62 of pre-circuit assembly 72.

Figure 1J:
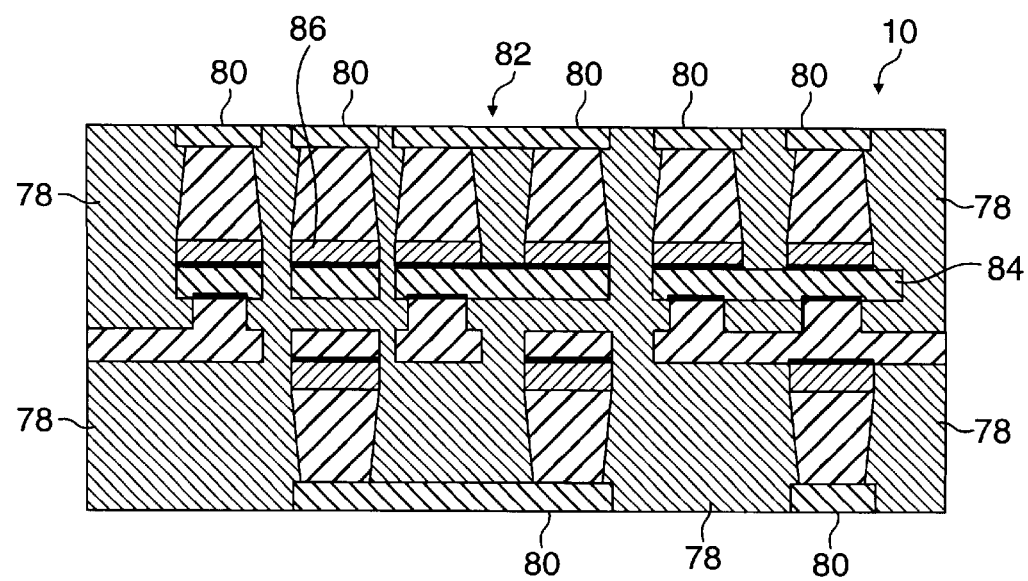

As best shown in FIG. 1(j), process 10 continues by applying a certain substance or material 78 to substantially "fill" apertures 76 within pre-circuit assembly 74 and further applying a certain substance or material 80 to substantially "cover" and/or overlay members 64, 70, thereby creating multi-layer circuit board assembly 82.

In one non-limiting embodiment of the invention, material 78 comprises a conventional and commercially available dielectric material such as an acrylic material and is substantially similar or identical to materials 22, 46. In a further non-limiting embodiment of the invention, material 78 is applied by laminatingly placing material 78 within apertures 76. In a further non-limiting embodiment of the invention, material 80 comprises a conventional and commercially available tin based alloy or any other suitable conductive epoxy. In a further non-limiting embodiment of the invention, material 80 is substantially similar to materials 26, 48. In a further non-limiting embodiment of the invention, material 80 is metallurgically bonded to members 64, 70.

It should be appreciated that multi-layer circuit board and/or assembly 82 includes electrically conductive "vias" or interconnection portions, such as portion 84, which allows various portions of the multi-layer electric circuit board 82 to be electrically interconnected while obviating the need to drill and/or electroplate a formed aperture.

It should further be appreciated that the selective etching of members 12, 34, 64, 68, 66, 70 and core portions 60, 62 allows the air-bridges or crossover connections, such as air-bridge 86, to be efficiently and relatively easily formed in a cost-effective manner and without drilling.

Figure 2A:
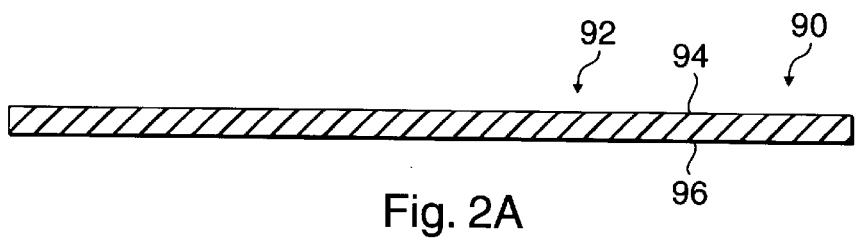
FIGS. 2(a)–(i) are successive sectional side views of a multi-layer circuit board being produced and/or formed in accordance with an alternate embodiment of the invention.

Referring now to FIGS. 2(a)–(i), there is shown a process 90 for making an electrical circuit board assembly in accordance with the teachings of an alternate embodiment of the invention. Particularly, process 90 begins by obtaining and/or providing a member 92 having a top or first surface 94 and a bottom or second surface 96, as best shown in FIG. 2(a). In one non-limiting embodiment of the invention, member 92 is generally rectangular and comprises a conventional and commercially available electrically conductive material such as copper and is generally rectangular in shape. In a further non-limiting embodiment of the invention, the thickness of member 92 is about two thousandths of an inch, although other sizes, shapes, and thicknesses may be utilized.

Figure 2B:
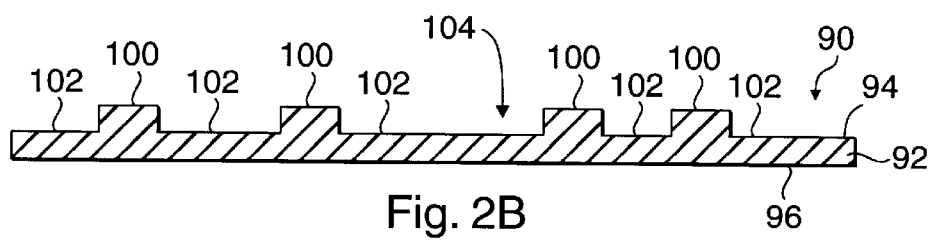

In a second step of process 90, which is best shown in FIG. 2(b), an electrically conductive material is selectively applied and operatively coupled to the top surface 94 of member 92, thereby selectively creating certain nubs, bumps, and/or protuberances 100 and certain recessed or depressed portions 102, thereby forming pre-circuit assembly 104. As later explained, protuberances 100 selectively form "vias" or "crossover circuit interconnections". In one non-limiting embodiment of the invention, protuberances 100 comprise a conventional and commercially available electrically conductive material such as solder. In a further non-limiting embodiment of the invention, protuberances 100 are formed by soldering electrically conductive members or material 100 to the top surface 94. In one non-limiting embodiment of the invention protuberances 15 have a substantially identical thickness as member 92.

Figure 2C:
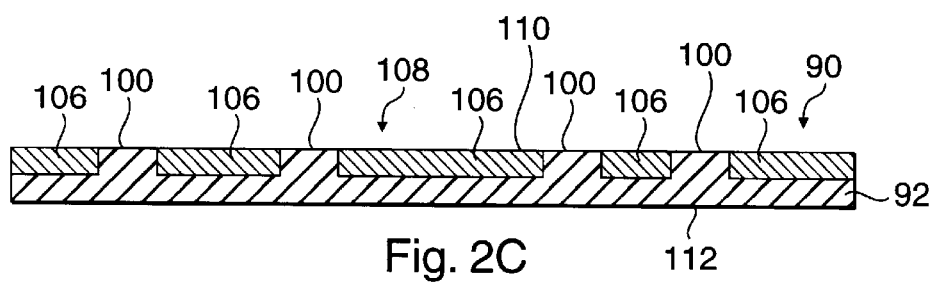

In the third step of process 90, which is best shown in FIG. 2(c), a certain substance or material 106 is applied to pre-circuit assembly 104 and substantially "fills" recessed or depressed portions 102, thereby forming a pre-circuit assembly 108 having a top surface 110 and a bottom surface 112. In one non-limiting embodiment of the invention, material 106 comprises a conventional and commercially available dielectric material, such as an acrylic material.

Figure 2D:
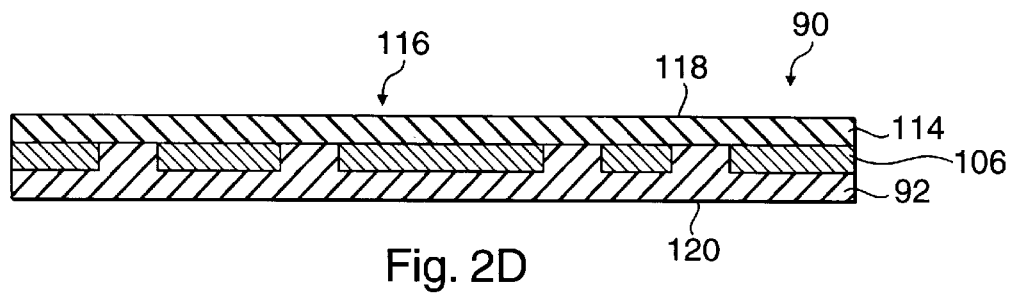

In the fourth step of the process 90, which is shown best in FIG. 2(d), a member 114 is connected to the top surface 110 of pre-circuit assembly 108, thereby forming pre-circuit assembly 116 having a top surface 118 and a bottom surface 120. In one non-limiting embodiment of the invention, member 114 operatively comprises a conventional and commercially available electrically conductive material such as copper. In a further non-limiting embodiment of the invention, the thickness of member 34 is about two thousandths of an inch.

Figure 2E:
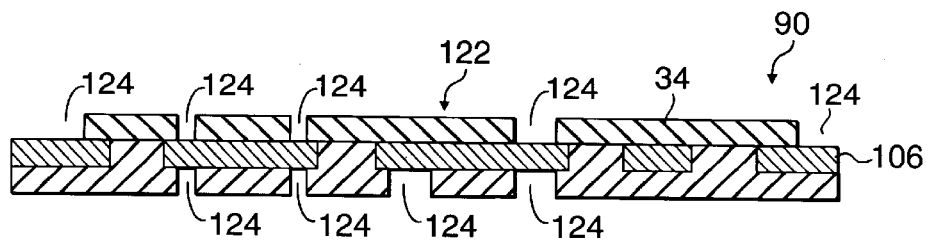

As best shown in FIG. 2(e), process 90 continues with the creation of a pre-circuit assembly 122 which is created by subjecting pre-circuit assembly 116 to a commercially available etchant material which selectively forms apertures through surfaces 118, 120 of pre-circuit assembly 116, thereby creating recessed or depressed portions 124 which each terminate upon and/or within material 106, effective to expose certain portions of material 106.

Figure 2F:
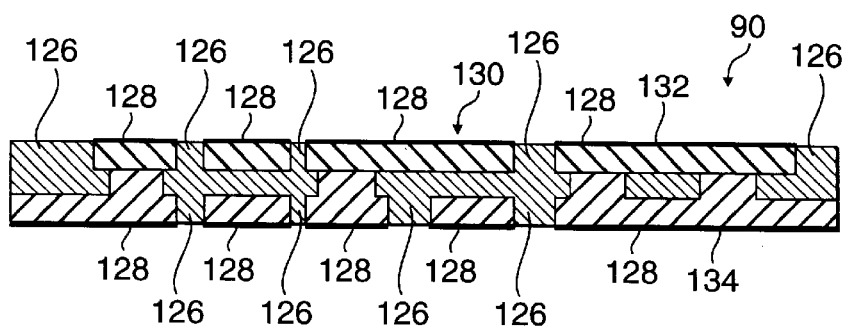

As best shown in FIG. 2(f), process 90 continues by further applying a certain substance or material 126 upon the exposed material 106, effective to substantially "fill" recessed, depressed, or aperture portions 124 and further applying a certain substance or material 128 to substantially "cover" and/or overlay the remaining or "unetched" portions of surfaces 118, 120, thereby creating pre-circuit assembly 130 having a top surface 132 and a bottom surface 134.

In one non-limiting embodiment of the invention, material 126 comprises a conventional and commercially available dielectric material such as an acrylic material and is substantially similar to or identical to material 106. In a further non-limiting embodiment of the invention, material 126 is laminated to the exposed material 124. In a further non-limiting embodiment of the invention, material 126 comprises a conventional and commercially available tin based alloy or any other conventional conductive epoxy material.

Figure 2G:
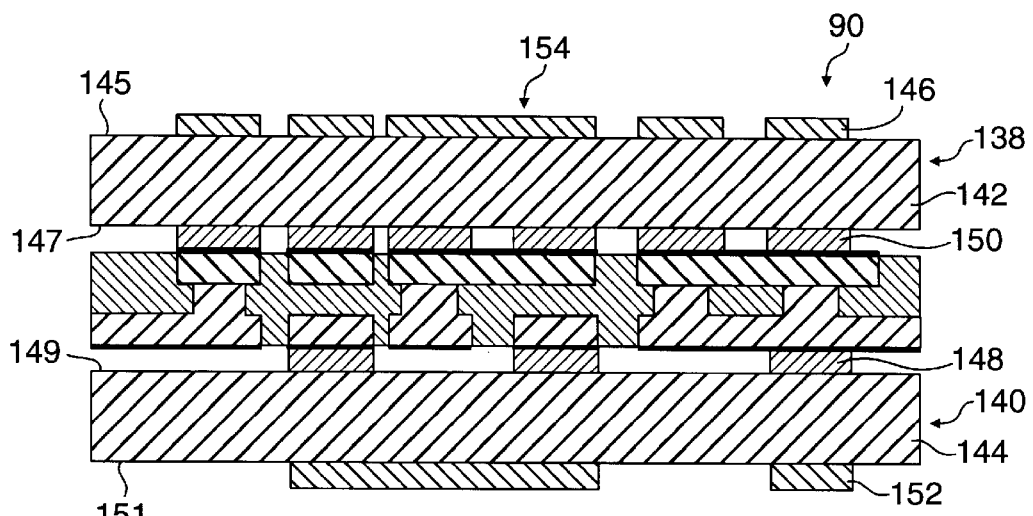
Figure 2H:
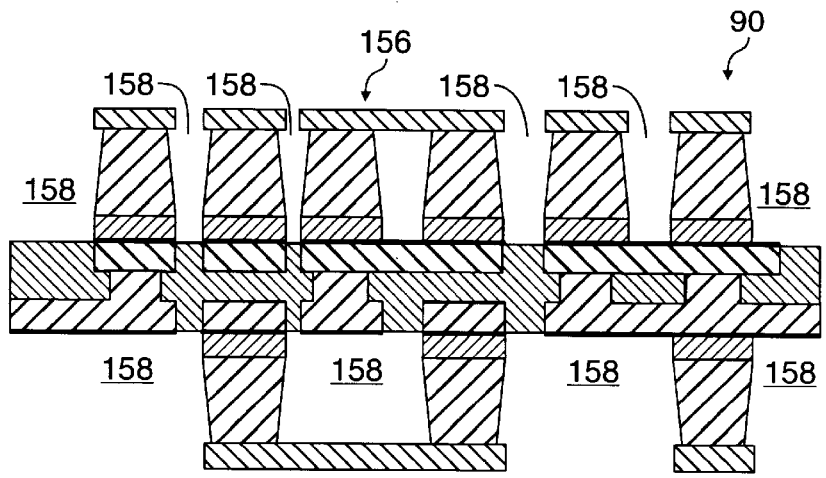
Figure 2I:
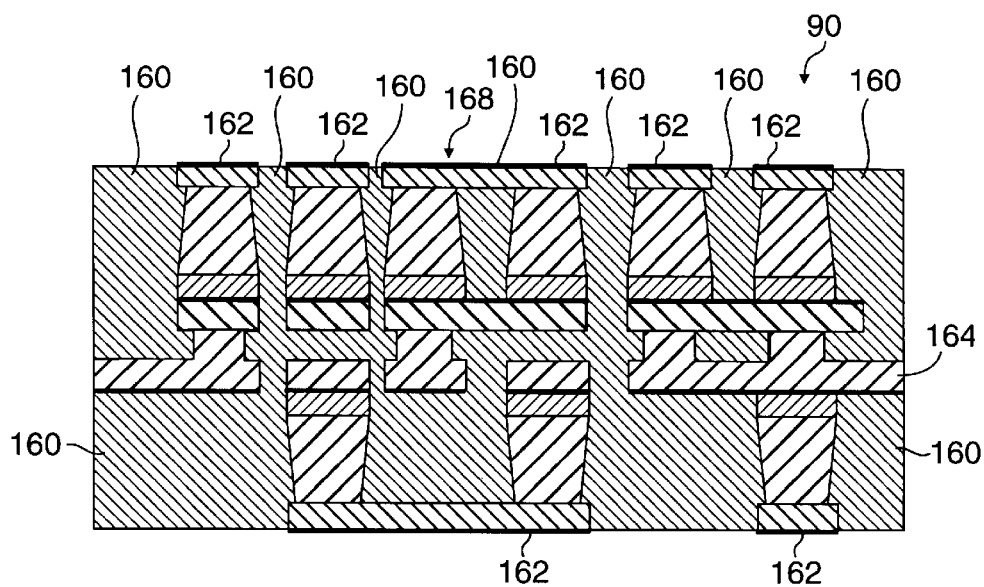

Process 90 continues, as shown best in FIG. 2(g) by obtaining and/or providing two pre-circuit assemblies 138, 140. Each pre-circuit assembly 138, 140, in one non-limiting embodiment of the invention, respectively includes a core portion 142, 144. As shown core member or portion 142 includes several portions or members 146, 150 which are respectively and operatively disposed upon top and bottom surfaces 145, 147. Core member or portion 144 includes several portions or members 148, 152 which are respectively and operatively disposed upon top and bottom surfaces 149, 151. Members 150 of pre-circuit assembly 138 are attached to the top surface 132 of pre-circuit assembly 130 (i.e., to material 128) and member 148 of pre-circuit assembly 140 is attached to the bottom surface 134 of pre-circuit assembly 130 (i.e., to material 128), thereby creating pre-circuit assembly 154. It should be appreciated that in other non-limiting embodiments of the invention, pre-circuit assemblies 138, 140 may be replaced by other conventional circuit boards including without limitation conventional "FR-4" type circuit boards or circuit boards of the polyamide type.

In one non-limiting embodiment of the invention, members 146, 148, 150, 152 each comprise a conventional and commercially available electrically conductive material such as copper. In a further non-limiting embodiment of the invention, core portions 142, 144 each comprise a conventional and commercially available electrically conductive material such as aluminum. In a further non-limiting embodiment of the invention, members 148, 150 are respectively attached to surfaces 134, 132 by respectively laminating members 148, 150 to surfaces 134, 132 (i.e., to material 128 which resides upon and/or forms these respective surfaces 134, 132).

As best shown in FIG. 2(*h*), process 90 continues with the formation of a pre-circuit assembly 156 which is created by selectively subjecting core portions 142, 144 of pre-circuit assembly 154 to a commercially available etchant material which selectively forms apertures 158 within core portions 142, 144 of pre-circuit assembly 154.

As best shown in FIG. 2(*i*), process 90 continues by applying a certain substance or material 160 to substantially "fill" apertures 158 within pre-circuit assembly 156 and further applying a certain substance or material 162 to substantially "cover" and/or overlay members 146, 152, thereby creating multi-layer circuit board assembly 168.

In one non-limiting embodiment of the invention, material 160 comprises a conventional and commercially available dielectric material such as an acrylic material and is substantially similar or identical to materials 106, 126. In a further non-limiting embodiment of the invention, material 160 is applied by laminatingly applying material 160 within apertures 158. In a further non-limiting embodiment of the invention, material 162 comprises a conventional and commercially available tin based alloy or any other suitable conductive epoxy. In a further non-limiting embodiment of the invention, material 162 is substantially similar to material 128. In a further non-limiting embodiment of the invention, material 162 is metallurgically bonded to members 146, 152.

It should be appreciated that multi-layer circuit board and/or assembly 168 includes electrically conductive "vias" or interconnection portions, such as portion 164, which allows various portions of the formed multi-layer electric circuit board 168 to be electrically interconnected while obviating the need to drill and/or electroplate a formed aperture.

It should be appreciated that process 90 produces a circuit assembly 168 which is substantially similar to the circuit assembly 82 made according to the steps of process 10. It should further be appreciated that additional pre-circuit assemblies may be selectively attached, coupled or selectively added to pre-circuit assembles 82, 162 in substantially the same manner as delineated above.

It should be understood that the invention is not limited to the exact embodiment or construction which has been illustrated and described but that various changes may be made without departing from the spirit and the scope of the invention.

What is claimed is:

1. A method for creating a circuit assembly comprising the steps of:

providing a first electrically conductive member;

creating at least one protuberance upon said first electrically conductive member;

providing a second electrically conductive member;

providing at least one pre-circuit assembly; and attaching said second electrically conductive member and said at least one pre-circuit assembly to said first electrically conductive member, thereby creating a multilayer circuit assembly and causing said at least one protuberance to extend within said multi-layer circuit assembly.

2. The method of claim 1 wherein said first electrically conductive member and said second electrically conductive member each comprise copper material.

3. The method of claim 1 wherein said step of attaching said second electrically conductive member and said at least one pre-circuit assembly to said first electrically conductive member comprises laminating said second electrically conductive member and said at least one pre-circuit assembly to said first electrically conductive member.

4. The method of claim 1 further comprising the steps of:

selectively applying a dielectric material between said first and second electrically conductive members; and selectively applying tin material upon said at least one protuberance.

5. The method of claim 4 wherein said dielectric material comprises acrylic.

6. The method of claim 1 wherein said at least one protuberance is formed by selectively applying a certain electrically conductive material upon said first member.

7. The method of claim 6 wherein said step of selectively applying a certain electrically conductive material upon said first member comprises soldering said electrically conductive material upon said first member.

8. A method for creating a circuit assembly, said method comprising the steps of:

providing a first electically conductive member;

etching a plurality of portions of said first electrically conductive member without attaching said first electrically conductive member to any support member, thereby creating a plurality of protuberances upon said first electrically conductive member;

providing a dielectric material;

disposing said dielectric material within said plurality of etched portions of said first electrically conductive member;

attaching a plurality of second electrically conductive members to said first electrically conductive member, thereby forming a multi-layer circuit assembly; and creating at least one interconnection path within said multi-layer circuit assembly by use of said plurality of protuberances.

9. The method of claim 8 wherein said step of creating a plurality of protuberances upon said first electrically conductive member further comprises the step of selectively applying solder upon said first electrically conductive member.

10. The method of claim 8 wherein each of said plurality of proturberances are substantially identical.

11. The method of claim 8 further comprising the step of selectively etching at least one of said plurality of second electrically conductive members to form at least one air-bridge.

12. The method of claim 11 further comprising the step of underfilling said at least one air-bridge with a certain material.

13. The method of claim 12 wherein said certain material is an acrylic material.

* * * * *